US008586971B2

(12) United States Patent
Afzali-Ardakani et al.

(10) Patent No.: US 8,586,971 B2
(45) Date of Patent: Nov. 19, 2013

(54) POLYMERIC MATERIAL, METHOD OF FORMING THE POLYMERIC MATERIAL, AND METHOD OF FORMING A THIN FILM USING THE POLYMERIC MATERIAL

(75) Inventors: Ali Afzali-Ardakani, Ossining, NY (US); Cherie R. Kagan, Bala-Cynwyd, PA (US)

(73) Assignee: International Business Machines Corporation, Armonk, NY (US)

( * ) Notice: Subject to any disclaimer, the term of this patent is extended or adjusted under 35 U.S.C. 154(b) by 260 days.

(21) Appl. No.: 13/050,519

(22) Filed: Mar. 17, 2011

(65) Prior Publication Data

US 2011/0163303 A1 Jul. 7, 2011

Related U.S. Application Data

(62) Division of application No. 11/771,854, filed on Jun. 29, 2007, now Pat. No. 7,932,128.

(51) Int. Cl.
*H01L 35/24* (2006.01)

(52) U.S. Cl.
USPC .................................. 257/40; 257/E51.001

(58) Field of Classification Search
USPC ............................................ 257/40, E51.001
See application file for complete search history.

(56) References Cited

U.S. PATENT DOCUMENTS

| | | | |
|---|---|---|---|
| 5,874,194 A * | 2/1999 | Wilson et al. | 430/108.22 |
| 6,963,080 B2 | 11/2005 | Afzali-Ardakani et al. | |
| 7,053,401 B2 | 5/2006 | Afzali-Ardakani et al. | |
| 7,125,989 B2 | 10/2006 | Afzali-Ardakani et al. | |
| 7,429,552 B2 | 9/2008 | Afzali-Ardakani et al. | |
| 2003/0144562 A1 | 7/2003 | Afzali-Ardakani et al. | |
| 2004/0119073 A1* | 6/2004 | Ardakami et al. | 257/72 |
| 2006/0032530 A1* | 2/2006 | Afzali-Ardakani et al. | 136/263 |
| 2006/0286314 A1* | 12/2006 | Park et al. | 428/32.6 |
| 2007/0262298 A1* | 11/2007 | Hu et al. | 257/40 |

OTHER PUBLICATIONS

Tulevski et al, "Chemical Complementarity in the Contacts for Nanoscale Organic Field-Effect Transistors," Journal of American Chemical Society, 2006, 128, pp. 1788-1789.*
Afzali et al, "N-sulfinylcarbamate-pentacene adduct: A novel pentacene precursor soluble in alcohols," Synthetic Metals, 155, 2005, pp. 490-494.*
Afzali et al, "High-Performance, Solution-Processed Organic Thin Film Transistors from a Novel Pentacene Precursor," Journal of American Chemical Society, 2002, 124, pp. 8812-8813.*
Weidkamp et al, "A Photopatternable Pentacene Precursor for Use in Organic Thin-Film Transistors," Journal of American Chemical Society, 2004, 126, pp. 12740-12741.*
Afzali, et al. "Photosensitive Pentacene Precursor: Sythesis, Photothermal Patterning, and Application in Thin Film-Transistors," Advanced Materials, 2003, 15(24), pp. 2066-2069.

* cited by examiner

*Primary Examiner* — Anthony Ho
(74) *Attorney, Agent, or Firm* — Vazken Alexanian; McGinn IP Law Group, PLLC

(57) ABSTRACT

A polymeric material includes a pendant polycyclic aromatic compound precursor.

5 Claims, 3 Drawing Sheets

300

300

POLYMERIC MATERIAL, METHOD OF FORMING THE POLYMERIC MATERIAL, AND METHOD OF FORMING A THIN FILM USING THE POLYMERIC MATERIAL

RELATED APPLICATIONS

The present Application is a Divisional Application of U.S. patent application Ser. No. 11/771,854 which was filed on Jun. 29, 2007 now U.S. Pat. No. 7,932,128.

BACKGROUND OF THE INVENTION

1. Field of the Invention

The present invention relates to a polymeric material which may be reliably used to make a thin film (e.g., an organic semiconductor thin film) having a uniform thickness.

2. Description of the Related Art

Soluble organic semiconductors have attracted much interest for use in inexpensive low-end electronic devices such as radio frequency identification (RFID) tags or displays. Among organic semiconductors, pentacene has shown real potential for having field effect mobility which rivals amorphous silicon.

Solution processed pentacene thin film transistors (TFT) have been formed using soluble pentacene precursors which after deposition on the surface could be converted to pentacene by moderate heating (e.g., see U.S. Pat. No. 6,963,080 to Afzali-Ardakani et al. entitled "THIN FILM TRANSISTORS USING SOLUTION PROCESSED PENTACENE PRECURSOR AS ORGANIC SEMICONDUCTOR"; and U.S. Pat. No. 7,125,989 to Afzali-Ardakani et al. entitled "HETERO DIELS-ALDER ADDUCTS OF PENTACENE AS SOLUBLE PRECURSORS OF PENTACENE").

However, since solutions of these precursors have very low viscosity and the molecules have relatively low molecular weights, uniform (e.g., uniform thickness) thin film coatings of these compounds are very difficult to form and are sometimes not repeatable.

SUMMARY OF THE INVENTION

In view of the foregoing and other problems, disadvantages, and drawbacks of the aforementioned compositions, methods and devices, it is a purpose of the exemplary aspects of the present invention to provide, inter alia, a polymeric material which may be reliably used to make a thin film (e.g., an organic semiconductor thin film) having a uniform thickness.

An exemplary aspect of the present invention is directed to a polymeric material with a pendant polycyclic aromatic compound precursor (e.g., a pendent pentacene precursor).

Another exemplary aspect of the present invention is directed to a method of forming a polymeric material with a pendant polycyclic aromatic compound precursor (e.g., a pendent pentacene precursor) which includes forming a polycyclic aromatic compound precursor including at least one polymerizable functionality, and polymerizing the polymerizable functionality to form the polymeric material with the pendant precursor.

Another exemplary aspect of the present invention is directed to a method of forming a thin film. The method includes depositing a solution comprising a polymeric material with a pendant polycyclic aromatic compound precursor (e.g., a pendent pentacene precursor) onto a substrate, removing a solvent from the deposited solution to form a thin film of the polymeric material with the pendant precursor, and heating the substrate to form a thin film of the polycyclic aromatic compound (e.g., pentacene) in a polymer matrix.

Another exemplary aspect of the present invention is directed to an organic semiconductor device which includes a thin film including a polycyclic aromatic compound (e.g., pentacene) in a polymer matrix.

With its unique and novel features, the exemplary aspects of the present invention may provide a material which may be reliably used to make a thin film (e.g., an organic semiconductor thin film) having a uniform thickness.

BRIEF DESCRIPTION OF THE DRAWINGS

The foregoing and other objects, aspects and advantages will be better understood from the following detailed description of the embodiments of the invention with reference to the drawings, in which.

DETAILED DESCRIPTION OF THE EXEMPLARY EMBODIMENTS OF THE INVENTION

Figure 1:
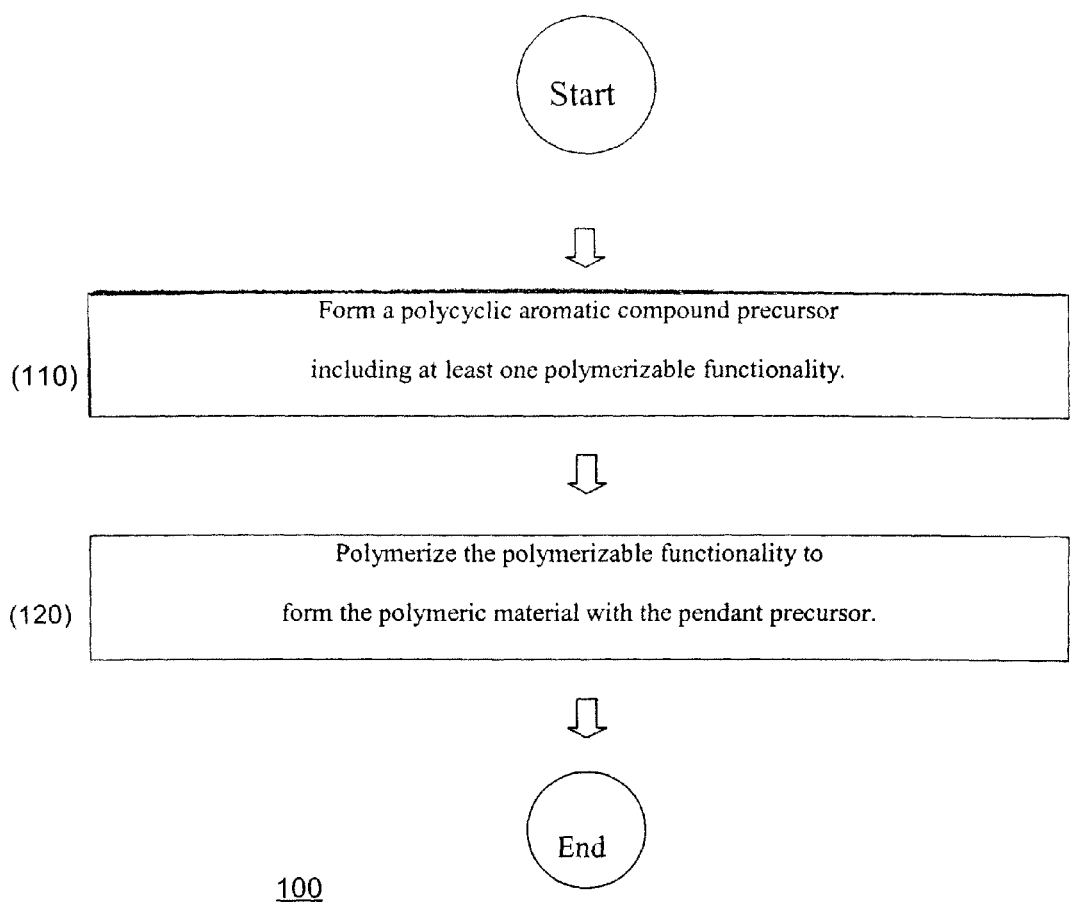
FIG. 1 illustrates a method 100 of forming a polymeric material with a pendant polycyclic aromatic compound precursor, according to an exemplary aspect of the present invention.

Referring now to the drawings, FIGS. 1-3B illustrate the exemplary aspects of the present invention.

An exemplary aspect of the present invention is directed to a polymeric material with a pendant polycyclic aromatic compound precursor. The polymeric material may include a polymer such as polystyrene, or other polymers such as poly (methylmethacrylate), poly(acrylate) or polyethers. The polycyclic aromatic compound may include, for example, oligothiophene, perylene, benzo[ghi]perylene, coronene and polyacene (e.g., pentacene, tetracene, hexacene).

FIG. 1 illustrates a method 100 of forming a polymeric material with a pendant polycyclic aromatic compound precursor, according to an exemplary aspect of the present invention. The method 100 includes forming (110) a polycyclic aromatic compound precursor including at least one polymerizable functionality. For example, the at least one polymerizable functionality may include one of acrylate, methacrylate, styryl, and vinyl ether.

Further, forming (110) the precursor including at least one polymerizable functionality may include reacting a polycyclic aromatic compound (e.g., pentacene) with a dienophile. The dienophile may include, for example, a compound that has at least one heteroatom such as N, O or S, connected by a double bond to a second heteroatom or carbon.

In particular, the dienophile may include at least one heteroatom bonded to an aromatic moiety, such as thioxonmalonates, azodicarboxylates, thioaldehyde, acylnitroso and N-sulfinylamides. For example, the dienophile may include N-sulfinyl-4-styrylamide or N-sulfinylmetacrylamide.

Further, the polycyclic aromatic compound may be reacted with the dienophile at low to moderate temperatures and in the presence of a catalyst such as a Lewis acid catalyst. The Lewis acid catalyst may include, for example, titanium tetrachloride, silver tetrafluoroborate and methyl rhenium trioxide. Any residue from the dienophile remaining in the product of the reaction may be removed either by washing with a solvent or by vacuum drying.

The method 100 may also include polymerizing 120 the polymerizable functionality to form the polymeric material with the pendant precursor. The polymerizing 120 may include, for example, one of light polymerization, free radical polymerization and ionic polymerization.

The polymeric material with a pendent polycyclic aromatic compound precursor may be soluble (e.g., soluble in common organic solvents) and may have a molecular weight in a range from 2000 to 100000.

Figure 2:
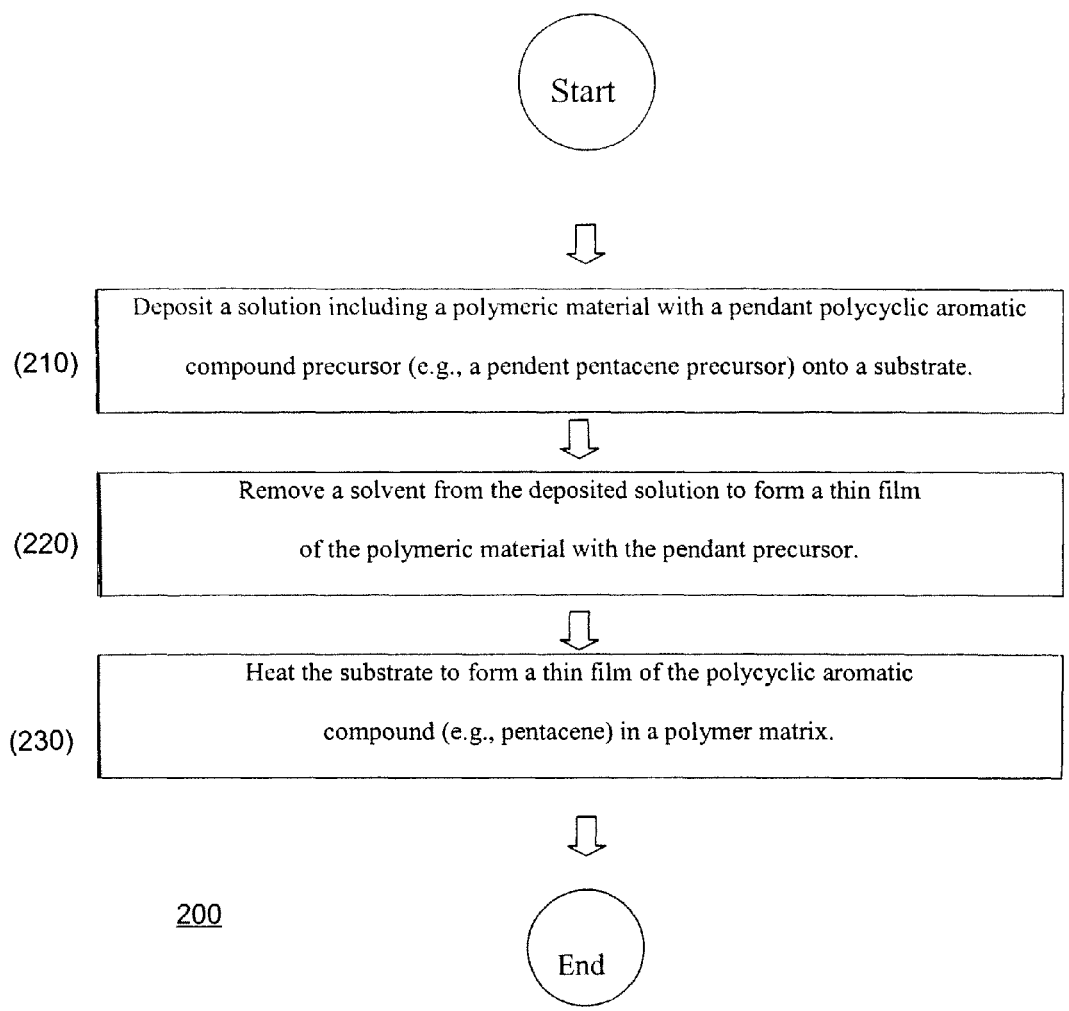
FIG. 2 illustrates a method 200 of forming a thin film (e.g., an organic semiconductor thin film), according to another exemplary aspect of the present invention.

FIG. 2 illustrates a method 200 of forming a thin film, according to another exemplary aspect of the present invention. The method 200 may include depositing (210) a solution including a polymeric material with a pendant polycyclic aromatic compound precursor (e.g., a pendant pentacene precursor) onto a substrate (e.g., glass substrate, metal substrate, polymer substrate, silicon substrate, etc.). The depositing (210) may be performed, for example, by pouring, spraying, spin-coating, dip-coating, screen printing, micro-contact printing, doctor blading, etc.

The solution may include the polymeric material dissolved (e.g., substantially dissolved) in a solvent (e.g., an organic solvent). The solvent may include, for example, chloroform, tetrachloroethane, tetrahydrofuran (THF), toluene, ethyl acetate, methyl ethyl ketone (MEK), dimethyl formamide, dichlorobenzene, propylene glycol monomethyl ether acetate (PGMEA) or mixtures of any of these.

Further, the solution including the polymeric material may include a viscosity of at least 50 cps, but no greater than 100000 cps.

The method 200 may further include removing (220) the solvent from the deposited solution to form a thin film of the polymeric material with a pendant polycyclic aromatic compound precursor. For example, the solvent may be removed by using heat to drive off the solvent.

The method 200 may also include heating (230) the substrate to form a thin film of the polycyclic aromatic compound (e.g., pentacene) in a polymer matrix. This may be performed, for example, by heating the substrate to a temperature in a range from about 100° C. to 200° C.

The method 200 may also include forming the polymeric material with a pendant polycyclic aromatic compound precursor (e.g., a pendent pentacene precursor). As described above, the polymeric material with a pendant polycyclic aromatic compound precursor may be formed by forming a polycyclic aromatic compound precursor including at least one polymerizable functionality, and polymerizing the polymerizable functionality to form the polymeric material with a pendant polycyclic aromatic compound precursor.

An exemplary aspect of the method 200 may be represented by the following scheme:

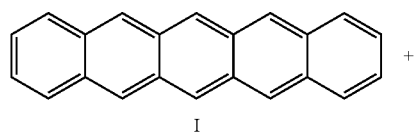

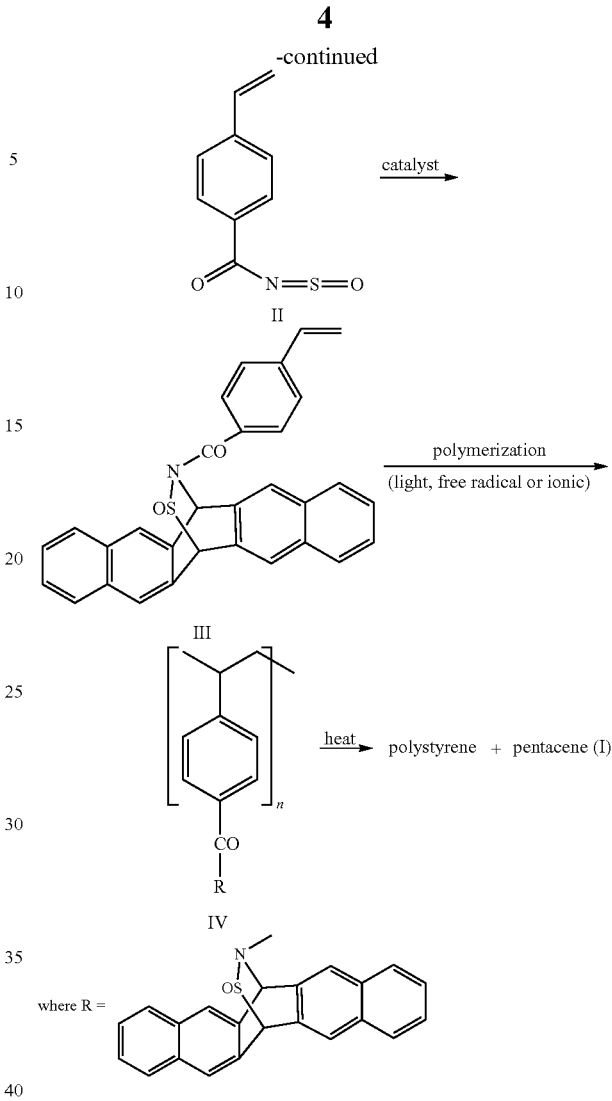

In this scheme, pentacene (I) may be reacted with a dienophile such as N-sulfinyl-4-styrylamide (II) in the presence of a Lewis acid catalyst to give the monomeric pentacene precursor adduct (III). The styryl functionality of the monomeric adduct (III) may be polymerized in the presence of light or free radical generators to form polystyrene with pentacene pendant (IV).

A film of this polymeric material (IV) may then be formed (e.g., coated) on a substrate and the solvent may be driven off to form a uniform thin film of this polymeric material. The substrate may then be heated at a moderate temperature (e.g., 100° C. to 200° C.) which may result in the formation of pentacene in a matrix of polystyrene.

FIG. 3 illustrates an organic semiconductor device 300, according to the exemplary aspects of the present invention. The device 300 may include a thin film 310 which includes a polycyclic aromatic compound (e.g., pentacene) in a polymer matrix (e.g., a polystyrene matrix). The thin film may have, for example, a thickness in a range from about 5 nm to 200 nm, and in an exemplary aspect the thickness of the thin film may be in a range from about 10 nm to about 50 nm.

Further, the thin film may include a substantially uniform thickness. For example, a thickness of the thin film may vary by no greater than about 1.0 micrometer over the entire thin film.

For example, the organic semiconductor device may include a thin film transistor (TFT). Such a thin film transistor may be used, for example, in electronic devices such as radio frequency identification (RFID) tags or displays. For example, the thin film transistor may include a channel region (e.g., a p-type channel region) which includes the thin film.

That is, the TFT may use a thin film of polycyclic aromatic compound in a polymer matrix (e.g., pentacene in a polystyrene matrix), as an organic semiconductor channel. Generally, the TFT may be formed by depositing a solution including the polymeric material with a pendant polycyclic aromatic compound precursor on a substrate (e.g., a highly doped silicon substrate) covered with a thin film of thermally grown oxide as gate dielectric, and then heating the solution to drive off the solvent. The substrate may then be heated to convert the thin film of the polymer material with a polycyclic aromatic compound precursor to a thin film of the polycyclic aromatic compound in a polymer matrix. Source and drain electrodes may then be deposited on top of the thin film of polycyclic aromatic compound in a polymer matrix film to get a TFT device.

The TFT may also include a gate electrode such as a patterned metal gate electrode formed on a substrate or a conducting material such as, a conducting polymer, which is then coated with an insulator. The insulator may include, for example, an oxide, nitride, a ferroelectric or an organic polymeric compound.

Figure 3A:
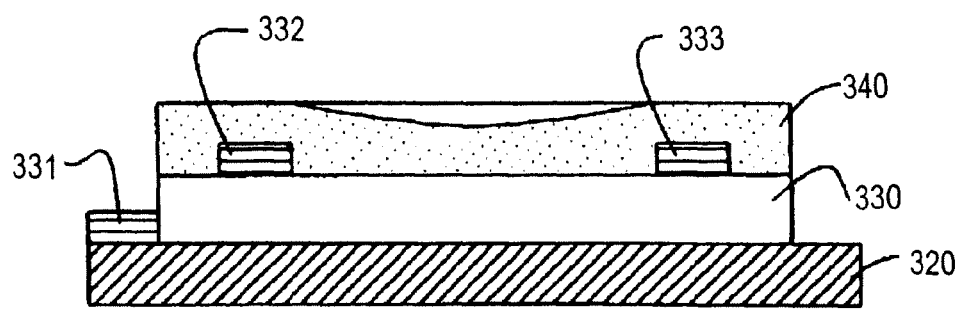
FIGS. 3A-3B illustrate an organic semiconductor device 300, according to an exemplary aspect of the present invention.
Figure 3B:
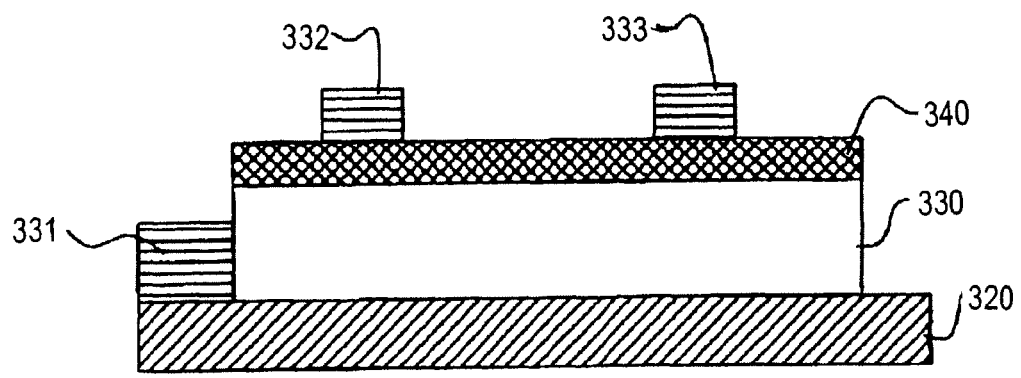

FIGS. 3A-3B illustrate an organic semiconductor device 300, according to an exemplary aspect of the present invention. As illustrated in FIG. 3A-3B, the organic semiconductor device 300 may include a TFT having a substrate 20 (e.g., glass, silicon, or plastic substrate), a layer of dielectric 30 formed on the substrate 20. The substrate 20 may include, for example, glass, polyethylenenaphthalate (PEN), polyethyleneterephthalate (PET), polycarbonate, polyvinylalcohol, polyacrylate, polyimide, polynorbornene, polyethersulfone (PES), etc. The dielectric 30 may include, for example, silicon dioxide, silicon nitride, aluminum oxide, $PbZr_xTi_{1-x}O_3$ (PZT), $Bi_4Ti_3O_{12}$, $BaMgF_4$, $Ba(Zr_{1-x}Ti_x)O_3$ (BZT) and organic polymeric compounds like MYLAR™, Polyethylene Terephthalate, polycarbonate and polyimide.

The device 300 may, for example, be fabricated in at least two different geometries: top contact and bottom contact geometries as shown in FIGS. 3A and 3B.

In the bottom contact geometry of FIG. 3A, a thin film of dielectric 330 may be formed on substrate 320. Three contacts may then be formed on the substrate 320 (e.g., contact 331) and dielectric 330 (e.g., contacts 332, 333), and the thin film including a polycyclic aromatic compound in a polymer matrix 340 (e.g., pentacene in a polystyrene matrix) may be formed on the dielectric 330 and contacts 332, 333. The contacts may include, for example, a metal such as gold (Au), silver (Ag), nickel (Ni), indium tin oxide (ITO), chromium (Cr), etc. The device can be rinsed with solvents to remove any unreacted starting materials or products.

In the top contact geometry of FIG. 3B, the dielectric layer 330 may be formed on the substrate 320, and the thin film including a polycyclic aromatic compound in a polymer matrix 340 may be formed on the dielectric layer 330. Then, contacts 332 and 333 may be formed (e.g., through a shadow mask).

In summary, the exemplary aspects of the present invention may include a polymeric material with pendant polycyclic aromatic compound precursor which can be deposited from solution into a uniform thin film and which after removing the solvent(s), may be converted to polycyclic aromatic compound. In this approach very uniform coating of polycyclic aromatic compound may be obtained.

For example, the polymeric material may be formed by synthesizing a polycyclic aromatic compound precursor which includes at least one polymerizable functionality (acrylate, methacrylate, styryl, vinyl ether, etc.), and then polymerizing the functionality to form a polymeric material with pendant polycyclic aromatic compound precursors.

In an exemplary aspect of forming a polymeric material of the present invention, pentacene (I) may be reacted with a dienophile such as N-sulfinyl-4-styrylamide (II) in the presence of a Lewis acid catalyst to give the monomeric pentacene precursor adduct (III). The styryl functionality of the monomeric adduct (III) may be polymerized in the presence of light or free radical generators to form polystyrene with pentacene pendant.

The polymeric material may be soluble in common organic solvents and, depending on its molecular weight, may form a viscous solution. A film of this polymeric material may then be formed (e.g., coated) on a substrate and the solvent may be driven off to form a uniform thin film of this polymeric material. The substrate may then be heated at a moderate temperature (e.g., 100° C. to 200° C.) which may result in the formation of pentacene in a matrix of polystyrene.

With its unique and novel features, the exemplary aspects of the present invention may provide a material which may be reliably used to make a thin film (e.g., an organic semiconductor thin film) having a uniform thickness.

While the invention has been described in terms of one or more embodiments, those skilled in the art will recognize that the invention can be practiced with modification within the spirit and scope of the appended claims. Specifically, one of ordinary skill in the art will understand that the drawings herein are meant to be illustrative, and the design of the inventive assembly is not limited to that disclosed herein but may be modified within the spirit and scope of the present invention.

Further, Applicant's intent is to encompass the equivalents of all claim elements, and no amendment to any claim in the present application should be construed as a disclaimer of any interest in or right to an equivalent of any element or feature of the amended claim.

What is claimed is:
1. A polymeric material with a pendant polycyclic aromatic compound precursor,
wherein said polymeric material is represented by the formula:

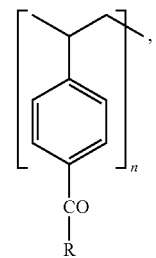

where R comprises said pendant polycyclic aromatic compound precursor.

2. The polymeric material of claim 1, wherein said pendant polycyclic aromatic compound precursor comprises a pendant pentacene precursor which is represented by the formula:

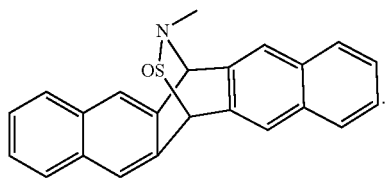

3. The polymeric material of claim 1, wherein the polycyclic aromatic compound comprises a member selected from the group consisting of oligothiophene, perylene, benzo[ghi]perylene, coronene and polyacene.

4. The polymeric material of claim 1, wherein the polycyclic aromatic compound comprises a member selected from the group consisting of pentacene, tetracene and hexacene.

5. The polymeric material of claim 1, wherein the polymeric material with a pendent polycyclic aromatic compound precursor is soluble in an organic solvent and has a molecular weight in a range from 2000 to 100000.

* * * * *